United States Patent [19]
Lee

[11] Patent Number: 6,067,268
[45] Date of Patent: May 23, 2000

[54] REDUNDANCY FUSE BOX AND METHOD FOR ARRANGING THE SAME

[75] Inventor: Ho-cheol Lee, Seoul, Rep. of Korea

[73] Assignee: Samsung Electronics, Co., Ltd., Suwon, Rep. of Korea

[21] Appl. No.: 09/110,630

[22] Filed: Jul. 6, 1998

Related U.S. Application Data

[63] Continuation of application No. 08/777,514, Dec. 30, 1996, abandoned.

[30] Foreign Application Priority Data

Dec. 28, 1995 [KR] Rep. of Korea ................ 95-62178

[51] Int. Cl.[7] ....................................... G11C 7/00
[52] U.S. Cl. ........................ 365/225.7; 365/200
[58] Field of Search ................ 365/200, 225.7; 327/524, 525

[56] References Cited

U.S. PATENT DOCUMENTS

| | | | |
|---|---|---|---|
| 5,327,380 | 7/1994 | Kersh | 365/195 |
| 5,337,277 | 8/1994 | Jang | 365/200 |
| 5,357,470 | 10/1994 | Namekawa | 365/225.7 |

*Primary Examiner*—A. Zarabian
*Attorney, Agent, or Firm*—Marger Johnson & McCollom, P.C.

[57] ABSTRACT

A redundancy fuse box of a semiconductor memory device which minimizes address line loading by organizing fuse cells into fuse cell groups sharing the same sub-address line. The address signal therefore has to traverse across a shorter distance along the semiconductor device, which contributes to a reduction in cell line loading. The redundancy fuse box includes a plurality of fuse cells, each having a transistor and fuse, to which an address signal of a memory cell is applied. The respective fuse boxes are constructed as one fuse box by being laid out in the same place. The fuse box includes a plurality of fuse cells which receive the same address signal along a common sub-address line and is wired so that outputs of the fuse cells which received the same address signal contribute to different redundancy enable signals.

6 Claims, 5 Drawing Sheets

REDUNDANCY FUSE BOX AND METHOD FOR ARRANGING THE SAME

The present application is based on Korea Patent Application No. 95-62178 which is incorporated herein by reference for all purposes and is a continuation of U.S. patent application Ser. No. 08/777,514 filed Dec. 30, 1996.

BACKGROUND OF THE INVENTION

1. Field of the Invention

The present invention relates to a semiconductor memory integrated circuit, and more particularly, to a redundancy fuse box of a semiconductor memory device and a method for arranging the same.

2. Background of the Prior Art

Highly integrated semiconductor devices include increasing numbers of redundancy cells that replace defective cells. Redundant cells are used to improve the yield in mass manufactured semiconductor device and consequently save on manufacturing costs.

A semiconductor memory cell array is generally constructed by a normal cell array and a redundancy cell array. In case defects are found in the normal cell, the defective normal cell is replaced with the redundancy cell by enabling a word line of the redundancy cell by an output of a redundancy fuse box. In order to replace the defective normal cell, the redundancy replacement cell is activated by a signal generated by cutting a fuse so as to reveal address information of the defective cell from a redundancy fuse box incorporated with an electric fuse.

FIG. 1 is a circuit diagram showing two conventional redundancy fuse box 20 arrangements known in the prior art. The first redundancy fuse box includes boxed portions 31 and 33 and buffer circuit 35. Portion 31 includes NMOS transistors $1, 3, \ldots, 15$ for gating addresses $RA_i$ (where i=0 to n), $RA_iB$ (where i=0 to n) and fuses connected to the NMOS transistors $1, 3, \ldots, 15$. Portion 33 includes PMOS transistors 21, 25 for precharging an output node (A), and buffer 35 for outputting a redundancy enable signal REDI by buffering a signal output from the output node (A).

The second redundancy fuse box includes boxed portions 71 and 73 and buffer circuit 75. Portion 71 includes NMOS transistors $41, 43, \ldots, 55$ for gating addresses $RA_i$ (where i=0 to n), $RA_iB$ (where i=0 to n) and fuses connected to the NMOS transistors $41, 43, \ldots, 55$. Portion 73 includes PMOS transistors 61, 65 for precharging an output node (B). Buffer circuit 75 operates to output a redundancy enable signal RED2 by buffering a signal output from the output node (B).

The two fuse boxes shown in the drawing are separated from each other and operate individually.

FIG. 2A is a timing diagram showing the operation of a circuit in the situation where the fuse is not cut in the redundancy fuse box. The apparent signal lag times are not intended but are included solely to indicate the signal generating order.

As shown in FIG. 2A, when a PDPX signal becomes high during an active state of the fuse box, an A node latches to a high state by operation of PMOS transistor 21 and inverter 23. In such a state, if address signal $RA_i$ (where i=0 to n) becomes high, the A node transitions to a low state from a high state by operation of the NMOS transistor connected to the fuse operationally linked to address $RA_i$. Consequently, the RED signal transitions to low from a high state.

Therefore, the now low RED signal activates a normal path and deactivates a redundancy path. During precharge, the PDPX signal becomes low after $RA_i$ becomes low, thus turning on PMOS transistor 25 and making the A node and RED node sequentially high.

FIG. 2B is a timing diagram showing the operation of the circuit in the situation where the fuse corresponding to a failed address is cut in the redundancy fuse box. Again, the apparent signal lag times are not intended but are included solely to indicate the signal generating order.

Namely, when addresses $RA_0, RA_1, \ldots, RA_{i-1}$, and $RA_i$ are respectively in a high state and failure occurs, the fuses connected to $RA_0, RA_1, \ldots, RA_{i-1}$, and $RA_i$ are cut and the fuses of $RA_0B, RA_1B, \ldots, RA_{i-1}B$, and $RA_iB$ are left intact. Thus, when PDPX becomes high, thereby latching the A node a high state by the operation of PMOS transistor 21 and inverter 23, the A node remains in a high state since the fuses connected to NMOS transistors 1, 5, 7 and 9 are cut. This occurs even though NMOS transistors 1, 5, 9 and 13, which correspond to high states at addresses $RA_0, RA_i, \ldots, RA_{i-1}$, and $RA_i$, are turned on. Consequently, the RED signal remains in a high state while addresses $RA_0B, RA_1B, \ldots, RA_{i-1}B$, and $RA_iB$ are all low.

Therefore, the high RED signal deactivates the normal path and activates the redundancy path. During precharge, the A node and RED remain in a high state even though the PDPX signal becomes low after the $RA_i$ address becomes low.

FIGS. 3 to 5 are block diagrams showing the conventional arrangement of the fuse box in a semiconductor memory. First, in a left side of a block diagram of FIG. 3, an address applied to a row decoder is gated with respect to fuse boxes 132 and 134. The fuse boxes 132 and 134 are arranged between the row decoders at a junction between a bit line (not shown) and a sense amplifier (not shown). An output of the fuse boxes, such as boxes 132 and 134, control any one, two, three, or four blocks, such as blocks 2, 4, 18 and 20, adjacent to the fuse box. Namely, the output of the fuse box 132 can be used even though any block has failed among the adjacent four blocks 2, 4, 18, and 20. Since the arrangement is symmetrical, the right portion in the block diagram is the same as that shown in the left portion.

The disadvantage of the conventional layout described above is that the fuse box must be laid out at the junction point between the bit line and the sense amplifier to be effective.

FIG. 4 shows a conventional symmetrical top to bottom fuse arrangement. In the upper block portion, a first fuse box 156, a second fuse box 158, a third fuse box 160, and a fourth fuse box 162 are each disposed between four blocks arranged in the horizontal direction of the chip. The output of the fuse boxes 156, 158, 160 and 162 passes through a peripheral circuit portion, connected to blocks 70 and 76, for applying redundancy information signals. The block redundancy is a method in which the redundancy information signals are collected in a block and a word line that has failed in another block is enabled in the block having a redundancy word line. Namely, as shown in FIG. 4, the line connected to the output port of the fuse boxes is determined according to the number of the fuse boxes. Therefore, if eight redundancy information signals are required for each of four arrays, at least sixteen lines should exist in each of the left and right directions. This exists because eight lines that pass the center of the chip are respectively formed in the upper portion and the lower portion. Thus, the size of the chip can be considerably affected.

A third conventional fuse/block arrangement is shown in FIG. 5. In the upper left portion of the block diagram of FIG.

5, fuse boxes 140 and 142 are arranged by extending the address line (not shown) applied to the row decoder to a peripheral circuit. The number of the address lines that can be extended to the peripheral circuit in a block is small due to the layout of repeated row decoders. As a result, only one fuse box 140 can be arranged in one block 36. Therefore, in FIG. 5, a second fuse box 142 is required to address one of the other blocks 34, 38, and 40. Furthermore, the address line extending from block 36 should be connected to the place where the second fuse box 142 is present or the address line should again be extended from the block 40 where the second fuse box 142 is present. Thus, the arrangement shown in FIG. 5 has a disadvantage in any case where the loading of the address line increases. Additionally, the RED line should be wired along the block as the number of the fuse boxes increase.

Each of these conventional fuse/block arrangements require additional wiring which is an inefficient use of chip real estate—a determiner of manufacturing cost. Accordingly, the need remains for an improved redundancy fuse box circuit over the prior art.

SUMMARY OF THE INVENTION

It is, therefore, an object of the present invention to provide a redundancy fuse box that minimizes chip size and address line loading.

It is another object of the present invention to provide a method for arranging redundancy fuse boxes on a chip.

To achieve the first object, there is provided a redundancy fuse box having a plurality of fuse cells which are constructed by transistors and fuses to which an address signal of a memory cell is applied, the redundancy fuse box being characterized in that the respective fuse boxes are constructed as one fuse box by being laid out in the same place.

The fuse box includes a plurality of fuse cell groups or pairs that receive the same address signal over a common respective sub-address line. Each pair is wired so that outputs of each one of the fuse cell pairs that received the same address signal contribute to different redundancy enable signals.

To achieve the second object, there is provided a method for arranging a redundancy fuse box, wherein the redundancy fuse box is located under an address line which is an output of a row decoder.

The fuses and transistors arc laid out under a power line and an address line, and a transistor for precharging output nodes which connect one ends of all the fuses and a circuit which produces a redundancy enable signal by buffering the signals output from the output nodes are laid out in a circuit region near the row decoder.

Therefore, according to the present invention, the increase of the loading of the address line can be prevented, without affecting the size of the chip, by preventing the address line from being extended to the peripheral circuit portion due to the layout of a plurality of fuse boxes in the same place, thus constructing the plurality of fuse boxes like a single fuse box and arranging the fuses and the NMOS transistors near the row decoder.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 5:
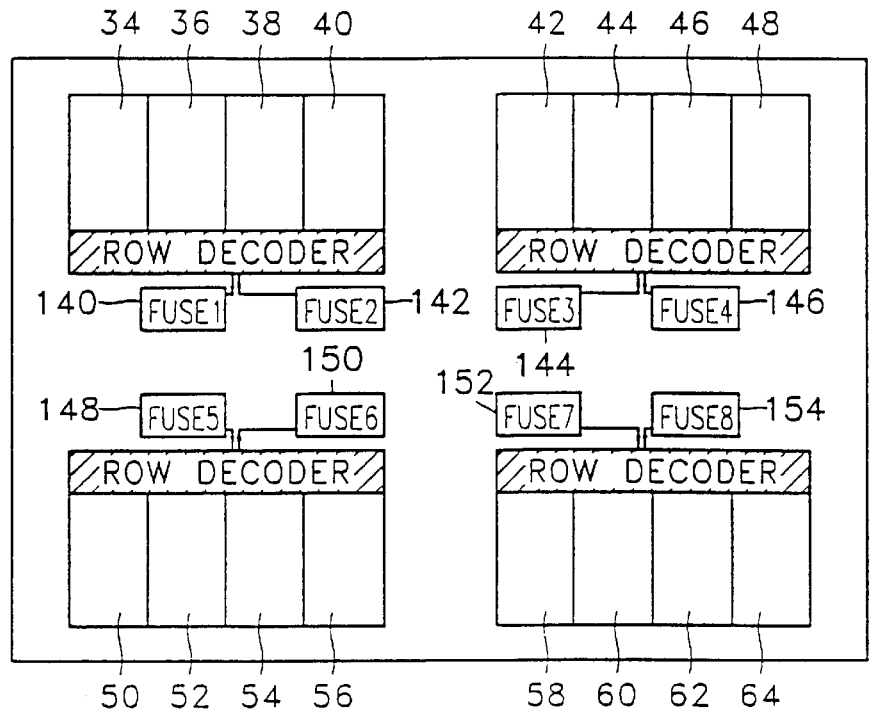
Figure 6:
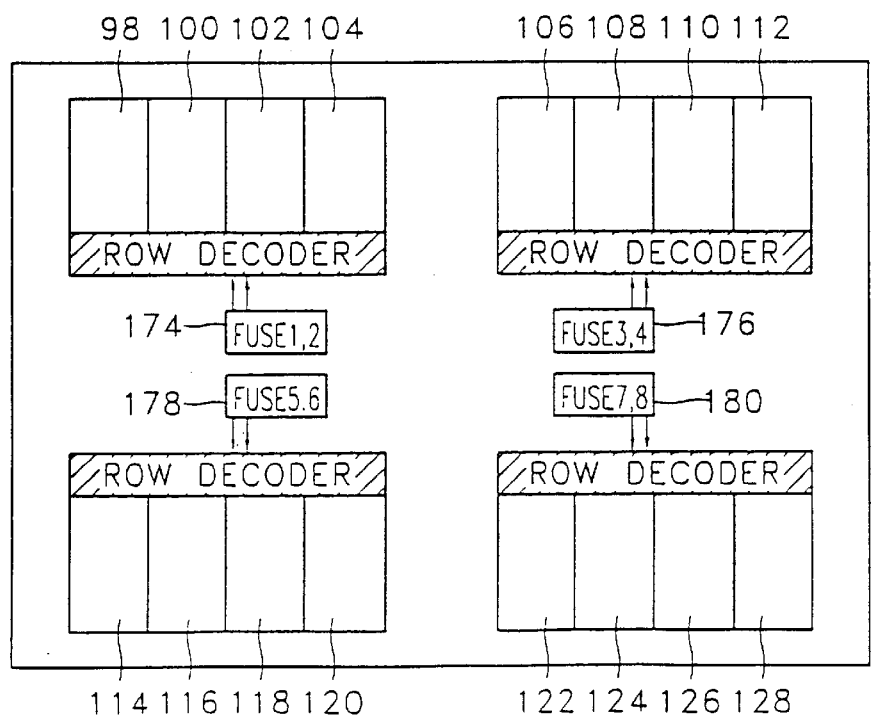
FIG. 6 is a block diagram showing the arrangement of a box in a chip according to the present invention.

Referring to FIG. 6, a method for arranging the fuse boxes according to the present invention is improved from the conventional technology as shown in FIG. 5. In the fuse box arrangement of FIG. 5, an address line is extended from a row decoder to a peripheral circuit portion, a plurality of fuse boxes are laid out in each block, and an RED line which is the output of the fuse box goes to the block where a redundancy word line is present. Namely, when the layout of FIG. 5 is performed by the method identical to that of FIG. 1, only one fuse box can be laid out in a block due to the limitation of the address line. However, the size of a block is large enough to layout a plurality of the fuse boxes.

Therefore, in the fuse box according to the present invention, the plural fuse boxes in the conventional technology are laid out like one fuse box under one block as shown in FIG. 6.

Figure 4:
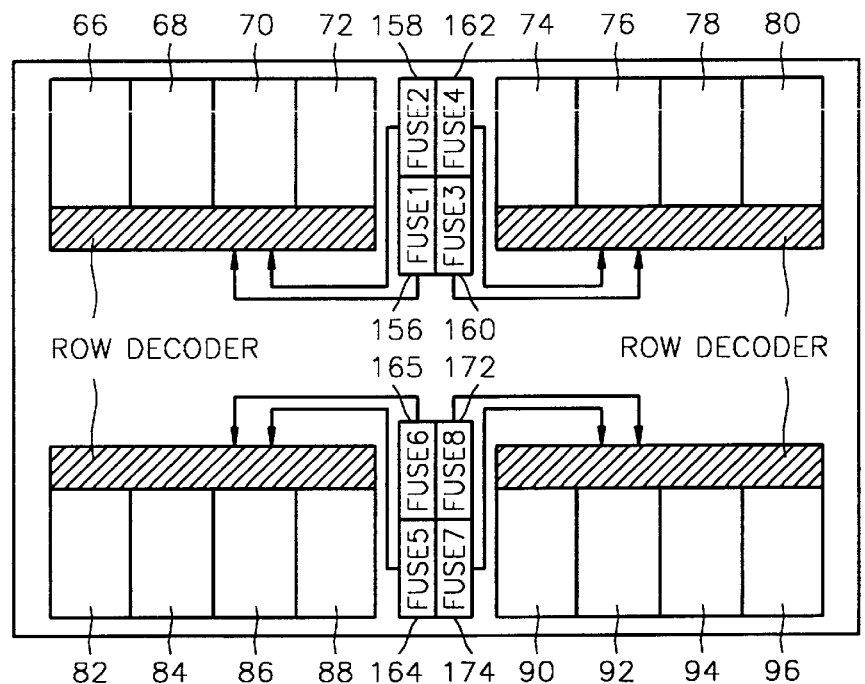
Figure 7:
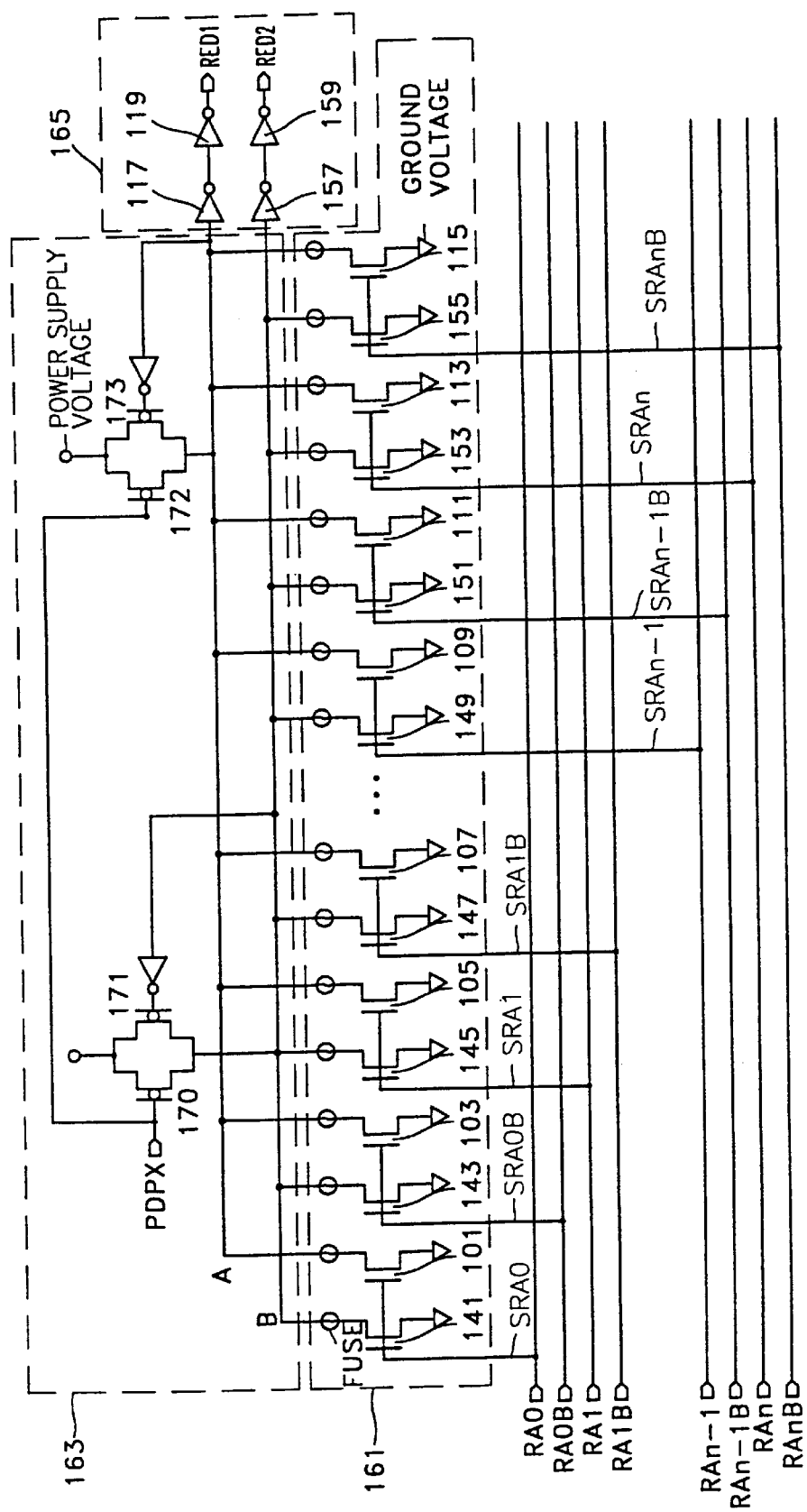
FIG. 7 is a circuit diagram of a plurality of fuse cells arranged within a redundancy fuse box according to the present invention.

In the present invention, it is possible to minimize the size of a chip and to effectively use the place where the layout will be performed in the chip, by preventing the increase of the layout area caused by an ineffective arrangement of the redundancy fuse box in the memory device as shown in FIGS. 4 and 5. Therefore, it is possible to reduce the size of the chip by effectively arranging the fuse boxes and preventing the lines of the output signals of the fuse box from passing through the chip. FIG. 7 is a circuit diagram of a redundancy fuse box in which a plurality of fuse boxes are laid out in the same place according to the present invention.

Referring to FIG. 7, the redundancy fuse box includes a portion 161 constructed by NMOS transistors 101 to 115 and 141 to 155 and respective fuses. A portion 163 is constructed using PMOS transistors 170 to 173 for precharging the output nodes A and B, each node connected to a selected one cell of the fuse cell pairs. The redundancy box constructed according to the preferred embodiment of the invention further includes a buffer 165 for outputting different redundancy enable signals RED1 and RED2 by buffering signals output from the respective output nodes A and B.

A redundancy fuse box constructed according to the present invention can comprise two or more fuse boxes. In the circuit shown in FIG. 7, two fuse boxes integrated according to the teachings of the present invention. As shown in FIG. 7, the redundancy fuse boxes are not laid out individually but laid out as one unit when the redundancy fuse boxes of the memory device is laid out in the chip. In detail, the plurality of fuses and NMOS transistors 101 to 115 and 141 to 155 are laid out in one place and produce different redundancy enable signals RED I and RED2 by receiving the same address information signals $RA_i$ and $RA_iB$ (where i=0 to n). Each of these fuses and respective transistors comprise a fuse cell. Each of the address lines $RA_i$ and $RA_iB$ include a single sub-address line (e.g., sub-address lines $SRA_i$ and $SRA_iB$) branched from the respective main address line which transmits the same address signal to the gates of the transistors of the fuse cells. Fuse cells responding to the same addresses are called fuse cell groups. As the circuit shown in FIG. 7 includes two fuse boxes integrated according to the teachings of the present invention, the fuse cell groups are known as fuse cell pairs. It is understood, however, that more than two fuse cells can be laid out adjacent one another to form the fuse cell group.

The proximate fuse cells which include transistors 141 and 101 respectively comprise a fuse cell pair associated with address $RA_0$. Here, the NMOS transistors 101 to 115 are used for generating a first redundancy enable signal RED1 by responding to the address information signals $RA_i$ and $RA_iB$. Also, the NMOS transistors 141 to 155 are used for generating a second redundancy enable signal RED2 by responding to the address information signals $RA_i$ and $RA_iB$. At this time, the address information signal includes either case of the respective address signals or at least two or more combined addresses.

Figure 1:
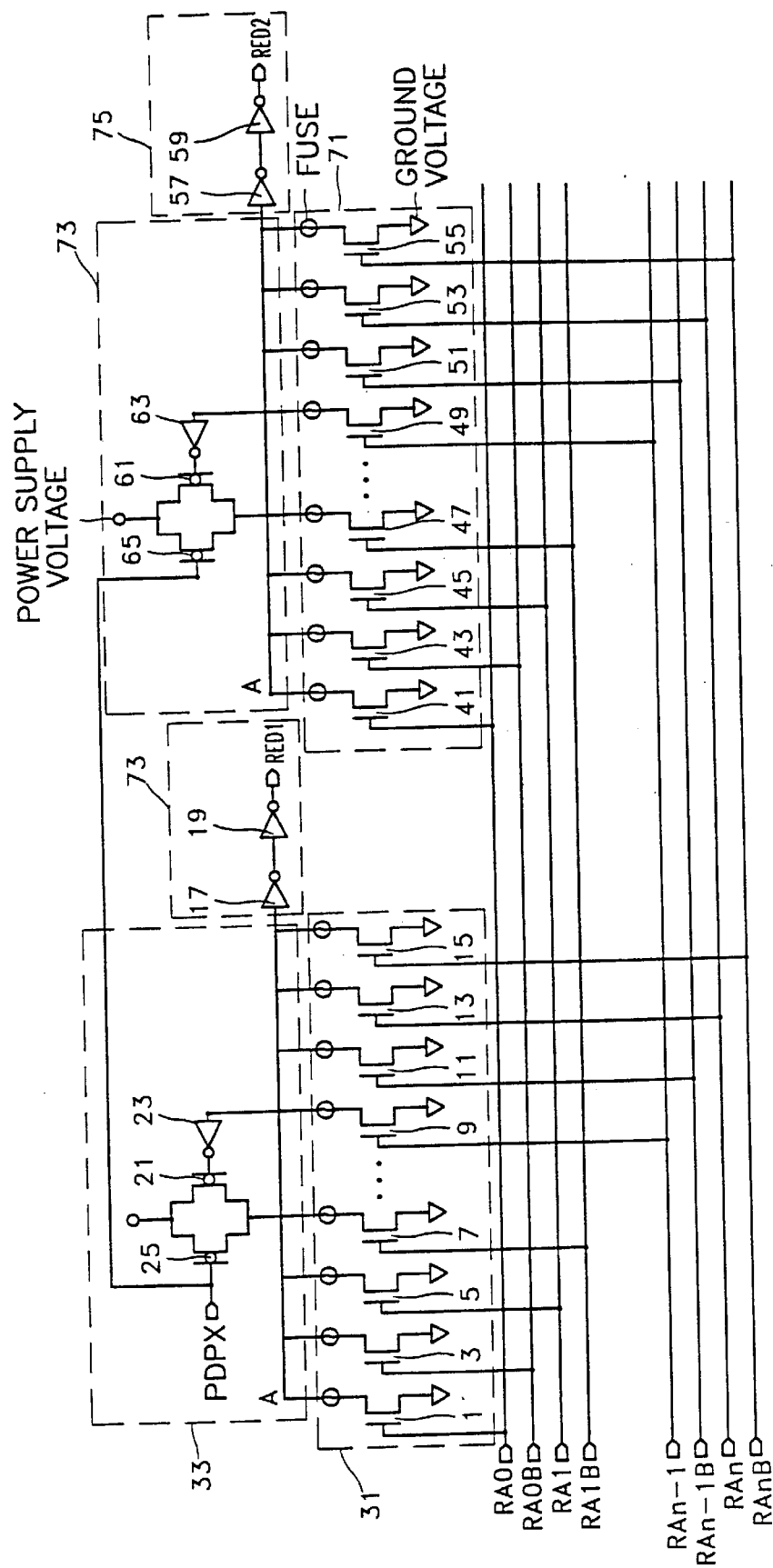
FIG. 1 is a circuit diagram showing a redundancy fuse box according to a conventional technology.
Figure 2A:
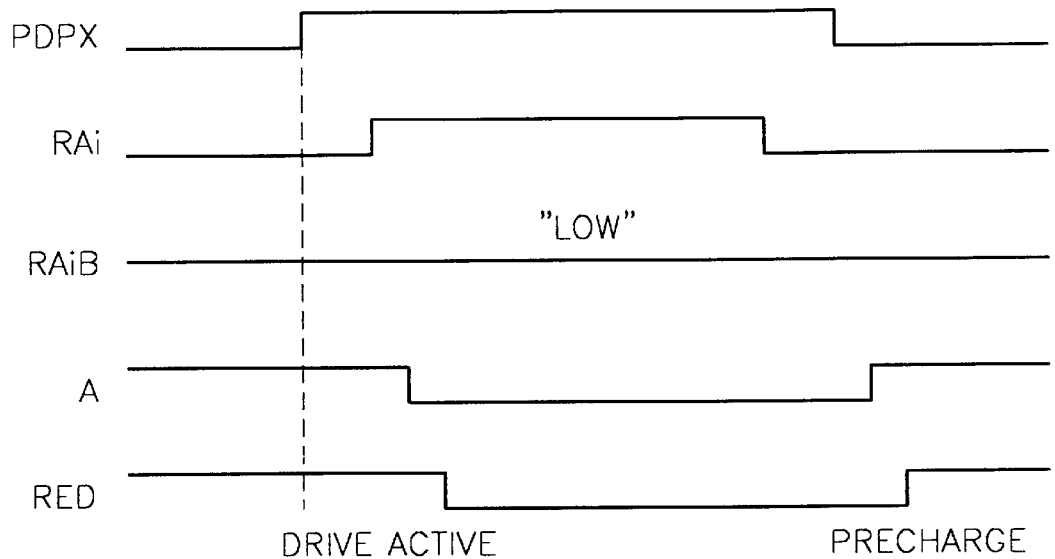
FIGS. 2A and 2B are timing diagrams showing operations of the circuit of FIG. 1 when a fuse is not cut in the redundancy fuse box and when the fuse is cut, respectively.
Figure 2B:
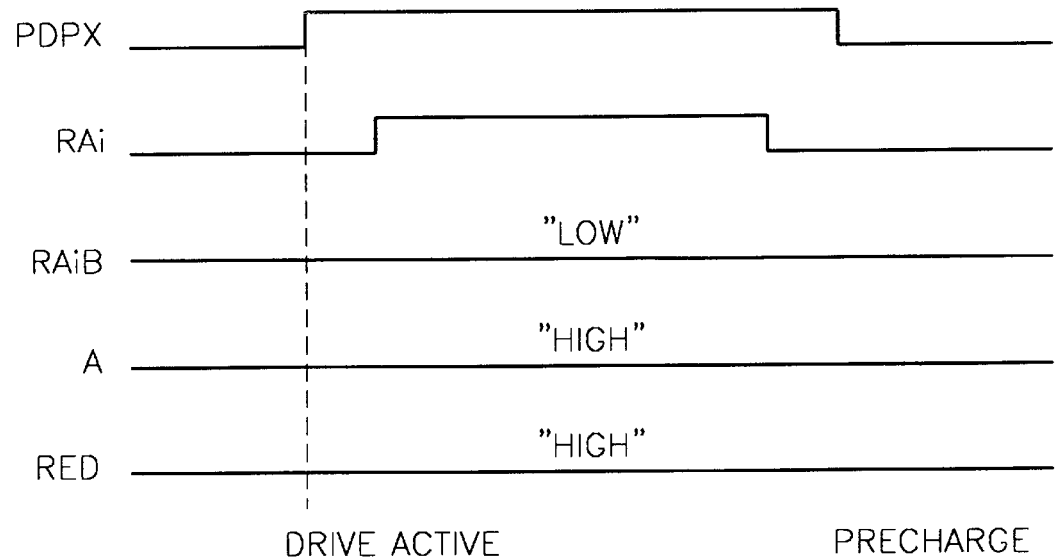
Figure 3:
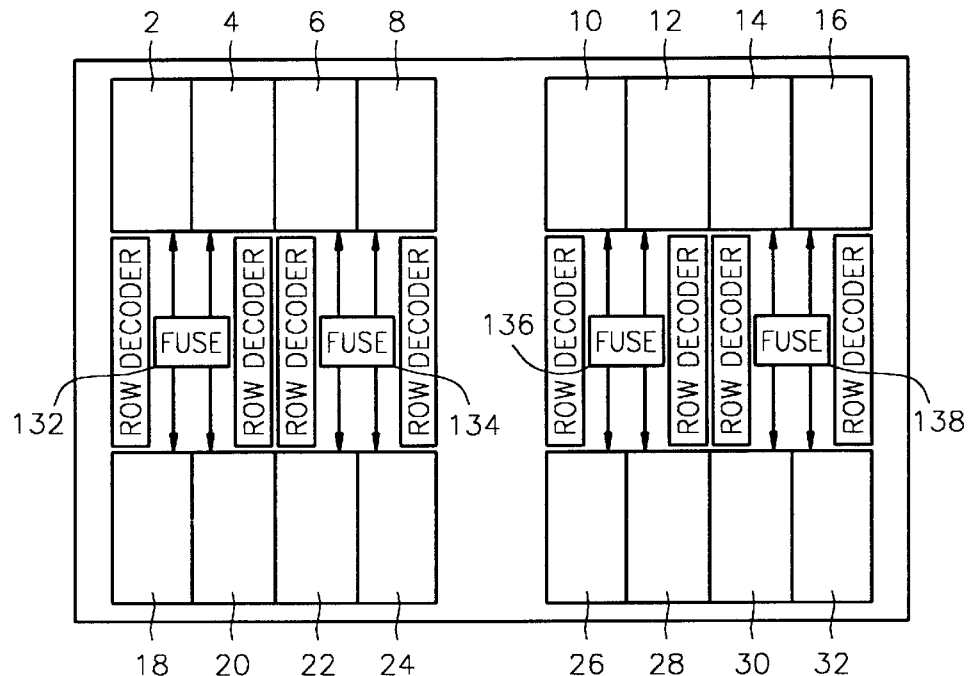
FIGS. 3 through 5 are block diagrams showing the arrangements of the fuse box in a conventional semiconductor memory.

The address line should be connected to the respective fuse boxes in FIG. 1. However, in FIG. 7, the same address lines as many as the fuse boxes are not connected to the fuse boxes but the address lines which are output lines of the row decoder are gated to the NMOS transistors 101 to 115 and 141 to 155 of the fuse boxes at the place near the output port of the row decoder. Therefore, the address lines for transmitting the address information signals $RA_i$ and $RA_iB$ become far shorter. At this time, the A node becomes longer.

It is possible to construct a plurality of transistors and fuses which receive the same address information signal by laying out the respective fuse boxes in the same place to be constructed as one fuse box. The wiring is performed so that the outputs of the transistors and fuses which receive the same address information signal contribute to the RED1 and RED2 signals which are different redundancy enable signals.

In such a method, the portion 161, including the fuses and the NMOS transistors 101 to 115 and 141 to 155, is laid out below the row decoder in which the conventional address busing and power line were present. The portion 163, including the transistors 170 to 173 to which PDPX is gated and the buffer circuit 165 for generating RED1 and RED2, is laid out in the circuit layer underneath the row decoder. This is compared to the arrangement as shown in FIG. 4 of the conventional technology in which the fuse boxes are horizontally arranged.

Therefore, by laying out the fuse boxes as shown in FIG. 7, it is possible to reduce the length and thus the loading of the address lines connected to the respective fuse boxes. Also, the size of the chip is not affected by a plurality of the RED lines extending across the center of the chip, compared with FIG. 4.

By example, the fuse box layout shown in FIG. 1 includes address line leads from address line $RA_iB$ to transistor 15 and to transistor 55. The address line loading for FIG. 1 is high because the address lines must traverse across two fuse boxes and include two long leads to the two transistors 15 and 55 which are gated by address $RA_iB$. The fuse box input shown in FIG. 7, however, includes only a single sub-address line $SRA_nB$ [long lead] to transistors 115 and 155 which are gated by address $RA_iB$. Laying out the fuse boxes in the same place confer the additional advantage of not necessitating the address line to traverse across two separated fuse boxes, thus decreasing loading further.

Therefore, it is possible to prevent the increase of the loading of the address lines, without affecting the size of the chip, by preventing the address lines from being extended toward the peripheral circuit portion by laying out a plurality of fuse boxes in the same place and constructing the plurality of fuse boxes like one fuse box.

The present invention is not restricted to the above embodiments, and it is clearly understood that many variations are possible within the scope and spirit of the present invention by anyone skilled in the art.

What is claimed is:

1. A redundancy fuse box of a semiconductor device comprising:

a plurality of fuse cell groups, each of said groups including plurality of fuse cells having a transistor and fuse to which a common predetermined address signal of a memory cell is applied;

a plurality of main address lines each carrying a predetermined one of a plurality of address signals;

a single sub-address line branched from each of the main address lines and coupled to transistor gates of the fuse cell group for communicating said predetermined one of the plurality of address signals to the fuse cell group.

2. The redundancy fuse box of claim, wherein said plurality of fuse cells in the fuse cell group are laid out adjacent to each other on a semiconductor substrate.

3. A method for arranging a redundancy fuse box of a semiconductor device comprising the steps of:

providing a plurality of fuse cells each having a transistor and a fuse;

providing a predetermined one of a plurality of address signals to said fuse cells over a single sub-address line branched from a main respective address line for communicating said predetermined one of the plurality of address signals to the plurality of fuse cells; and generating a redundancy enable signal in response to each of plurality of address signals.

4. The method for arranging a redundancy fuse box as claimed in claim 3, the method further including:

further disposing said fuses and transistors under a power line;

precharging output nodes which connect one end of all said fuses;

buffering the signals output from said output nodes; and disposing said charging transistor and said circuit in a circuit region near the row decoder.

5. A redundancy fuse box for use in a semiconductor device comprising:

a plurality of fuse cell pairs, each fuse cell pair being associated with one of a plurality of address signals, each fuse cell pair including a first fuse cell having a transistor and fuse capable of enabling a first redundancy enable signal in response to the associated one of the plurality of address signals, and a second fuse cell, laid out adjacent to said first fuse cell on said semiconductor device, having a transistor and fuse capable of enabling a second redundancy enable signal in response to the associated one of the plurality of address signals, said fuse cell pair being coupled to a single sub-address line branched from a respective main address line for communicating said associated one of the plurality of address signals to the fuse cell pair.

6. The redundancy fuse box according to claim 5, further including a first and second charging transistor associated with respective first and second redundancy enable signals.

* * * * *

UNITED STATES PATENT AND TRADEMARK OFFICE
CERTIFICATE OF CORRECTION

PATENT NO.    : 6,067,268
DATED         : May 23, 2000
INVENTOR(S)   : Lee

It is certified that error appears in the above-identified patent and that said Letters Patent is hereby corrected as shown below:

Column 4,
Line 7, "of a box" should read -- of a fuse box --.

Column 6,
Line 23, "of claim," should read -- of claim 1 --.

Signed and Sealed this

First Day of April, 2003

JAMES E. ROGAN
*Director of the United States Patent and Trademark Office*